(12) United States Patent
Weiss

(10) Patent No.: US 11,114,525 B2
(45) Date of Patent: Sep. 7, 2021

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventor: Guido Weiss, Pielenhofen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/488,548

(22) PCT Filed: Mar. 5, 2018

(86) PCT No.: PCT/EP2018/055343
§ 371 (c)(1),
(2) Date: Aug. 23, 2019

(87) PCT Pub. No.: WO2018/162412
PCT Pub. Date: Sep. 13, 2018

(65) Prior Publication Data
US 2020/0044118 A1    Feb. 6, 2020

(30) Foreign Application Priority Data
Mar. 7, 2017   (DE) .......................... 102017104742.5

(51) Int. Cl.
| H01L 21/44 | (2006.01) |
| H01L 23/52 | (2006.01) |
| H01L 49/02 | (2006.01) |
| H01L 21/768 | (2006.01) |
| H01L 33/00 | (2010.01) |

(52) U.S. Cl.
CPC ........ *H01L 28/75* (2013.01); *H01L 21/76871* (2013.01); *H01L 33/0037* (2013.01); *H01L 2221/1089* (2013.01)

(58) Field of Classification Search
CPC .................................................. H01L 21/76871
USPC ......... 438/627, 643, 653, 654; 257/751, 753
See application file for complete search history.

(56) References Cited

U.S. PATENT DOCUMENTS

| 8,969,200 B2* | 3/2015 | Hebding ............. H01L 25/0652 |
| | | 438/667 |
| 8,975,175 B1 | 3/2015 | Pass |
| 9,041,020 B2 | 5/2015 | Herrmann et al. |
| 9,918,382 B2* | 3/2018 | Al-Saud ............... H01L 31/046 |

(Continued)

FOREIGN PATENT DOCUMENTS

| DE | 102010045390 A1 | 3/2012 |
| DE | 102015112538 A1 | 2/2017 |

*Primary Examiner* — Calvin Lee
(74) *Attorney, Agent, or Firm* — Slater Matsil, LLP

(57) ABSTRACT

An optoelectronic component and a method for producing an optoelectronic component are disclosed. In an embodiment an optoelectronic component includes a semiconductor layer sequence having an active region configured to emit radiation, a dielectric layer, a solder layer including a first metal arranged on the dielectric layer and a seed layer arranged between the solder layer and the dielectric layer, wherein the seed layer includes the first metal and a second metal, wherein the second metal is less noble than the first metal, wherein an amount of the second metal in the seed layer is between 0.5 wt % and 10 wt %, and wherein the first metal is Au and the second metal is Zn.

20 Claims, 3 Drawing Sheets

(56) References Cited

U.S. PATENT DOCUMENTS

| | | |
|---|---|---|
| 10,699,948 B2 * | 6/2020 | Kubik ..................... C25D 5/022 |
| 2002/0076925 A1 | 6/2002 | Marieb et al. |
| 2008/0045035 A1 | 2/2008 | Lee et al. |
| 2009/0218694 A1 | 9/2009 | Kato et al. |
| 2009/0283787 A1 | 11/2009 | Donofrio et al. |
| 2013/0313594 A1 | 11/2013 | Han et al. |
| 2015/0118391 A1 | 4/2015 | Kilhenny |
| 2016/0111615 A1 | 4/2016 | von Malm et al. |
| 2016/0163663 A1 | 6/2016 | Kim et al. |
| 2018/0198045 A1 | 7/2018 | Perzlmaier et al. |
| 2019/0198395 A1 * | 6/2019 | Knechtel ............... H01L 23/481 |
| 2019/0385963 A1 * | 12/2019 | Chen ..................... H01L 24/80 |

\* cited by examiner

OPTOELECTRONIC COMPONENT AND METHOD FOR PRODUCING AN OPTOELECTRONIC COMPONENT

This patent application is a national phase filing under section 371 of PCT/EP2018/055343, filed Mar. 5, 2018, which claims the priority of German patent application 102017104742.5, filed Mar. 7, 2017, each of which is incorporated herein by reference in its entirety.

TECHNICAL FIELD

The invention relates to an optoelectronic component. Further, the invention relates to a method for producing an optoelectronic component.

BACKGROUND

For the galvanic deposition of a solder layer, which is particularly made of gold, a so-called seed layer is required for growth. So far, seed layers of gold have been used, which were made adherent by a thin adhesive layer of titanium on a dielectric layer underneath. If the seed layer has to be removed again at the non-galvanized sections, for example, to delimit an electrical contact, a plasma process for selective removal of the titanium layer is required in addition to the wet chemistry for the gold solder layer. The titanium adhesive layer serves as a bonding agent between the seed layer and the dielectric layer. However, the etching results during the plasma process to remove the titanium are poor and the titanium is not completely removed. This can lead to short circuits in the finished component.

SUMMARY OF THE INVENTION

Embodiments provide an improved optoelectronic component. In various embodiments, a component without an adhesive layer between the seed layer and the dielectric layer is to be produced. This makes it easier to produce the component and minimizes or eliminates short circuits in the component.

In at least one embodiment, the optoelectronic component has a semiconductor layer sequence. The semiconductor layer sequence comprises an active region which is configured for radiation emission. In particular, the semiconductor layer sequence emits radiation from the UV, IR or visible wavelength range during operation of the optoelectronic component. The component has a dielectric layer. The component has a solder layer. The solder layer comprises a first metal or consists of the first metal. The solder layer is arranged on the dielectric layer. A seed layer is arranged between the solder layer and the dielectric layer. The seed layer comprises the first metal and a second metal. In other words, the seed layer comprises the same first metal as the first metal of the solder layer and additionally a second metal. Preferably the second metal is not contained in the solder layer. The second metal is less noble than the first metal.

The amount of the second metal is preferred either between 0.5 wt % and 10 wt % in the seed layer or the ratio first metal to second metal is preferred between 95:5 and 99:1 in the seed layer.

According to at least one embodiment of the optoelectronic component, it comprises a semiconductor layer sequence. The semiconductor layer sequence preferably comprises a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein $0 \leq n \leq 1$, $0 \leq m \leq 1$ and $n+m \leq 1$ respectively. The semiconductor layer sequence may contain dopants as well as additional components. For the purpose of simplicity, only the essential components of the crystal lattice of the semiconductor layer sequence, so Al, As, Ga, In, N or P, are given, even if these may be partially replaced and/or supplemented by small quantities of other substances.

The semiconductor layer sequence has an active region with at least one pn-junction and/or with one or more quantum well structures. During operation of the semiconductor chip, electromagnetic radiation is generated in the active region. A wavelength of the radiation is preferably in the ultraviolet and/or visible range, especially at wavelengths between 420 nm and 680 nm, for example, between 440 nm and 480 nm.

According to at least one embodiment, the semiconductor layer sequence and/or the component is a light-emitting diode, or LED for short. The semiconductor layer sequence is then preferably configured to emit blue light. The component is preferably configured to emit white, blue, red or green light.

According to at least one embodiment, the component has a dielectric layer. The dielectric layer comprises a material selected from the group consisting of silicon oxide, silicon nitride, aluminum oxide, zirconium oxide, titanium oxide, yttrium oxide and silicon.

According to at least one embodiment, the dielectric layer provides insulation for the n- and p-contacting. N-contacting refers here to the fact that the n-doped semiconductor layer of the semiconductor layer sequence is electrically contacted by means of this contact. In other words, the n-contacting forms the n contact of the optoelectronic component. P-contacting refers here to the electrical contacting of the p-doped semiconductor layer of the semiconductor layer sequence. In other words, the p-contacting forms the p-contact of the optoelectronic component. The p-contacting can, for example, comprise a bond pad and/or one or more contact bars. This avoids a short circuit.

According to at least one embodiment, the component has a solder layer. The solder layer consists of or comprises a first metal. The solder layer is arranged on the dielectric layer. On the dielectric layer means here and in the following that the solder layer is arranged directly or indirectly in electrical and/or mechanical contact above the dielectric layer. In indirect contact, further layers or elements can be arranged between the dielectric layer and the solder layer.

According to at least one embodiment, the solder layer comprises a first metal. The first metal can be selected from a group comprising gold (Au), silver (Ag), platinum (Pt) and copper (Cu). Preferably the first metal is gold. In particular, the solder layer is configured to create a bond between the semiconductor layer sequence and a substrate, such as a ceramic, PCP or a printed circuit board substrate.

According to at least one embodiment, the component has a seed layer. The seed layer serves to provide a growth of the solder layer in the component. The seed layer is located between the solder layer and the dielectric layer. In particular, the seed layer is arranged directly to both the solder layer and the dielectric layer. This means here that no further layers, such as an adhesive layer of titanium, are arranged between the solder layer and the seed layer or the dielectric layer and the seed layer. The seed layer comprises a first metal and a second metal. The first metal of the seed layer corresponds to the first metal of the solder layer. In addition, the seed layer comprises a second metal. The second metal is different from the first metal. The second metal is less noble than the first metal.

In this context, it can mean that the second metal comprises a negative standard potential with respect to the standard hydrogen electrode. Base metals, for example, zinc react under normal conditions with oxygen from the air to form zinc oxide, so they oxidize. Aluminum can also oxidize to aluminum oxide and thus form a corrosion-resistant oxide layer that prevents further oxidation. The fact that the second metal is less noble than the first metal can also mean that the second metal has a smaller standard potential than the first metal. The standard potentials $E_o$ in volts of the corresponding metals are shown in the following table:

| Red. | Ox. | +n e⁻ | Standardpotential $E_0$ (Volt) |
|------|-----|-------|-------------------------------|
| Na   | $Na^+$    | +1 e⁻ | −2.714 |
| Mg   | $Mg^{2+}$ | +2 e⁻ | −2.363 |
| Al   | $Al^{3+}$ | +3 e⁻ | −1.662 |
| Zn   | $Zn^{2+}$ | +2 e⁻ | −0.763 |
| Cr   | $Cr^{3+}$ | +3 e⁻ | −0.744 |
| Fe   | $Fe^{2+}$ | +2 e⁻ | −0.400 |
| Cd   | $Cd^{2+}$ | +2 e⁻ | −0.403 |
| Sn   | $Sn^{2+}$ | +2 e⁻ | −0.136 |
| Pb   | $Pb^{2+}$ | +2 e⁻ | −0.126 |
| $H_2$| $2H^+$    | +2 e⁻ | 0.000  |
| Cu   | $Cu^{2+}$ | +2 e⁻ | +0.337 |
| Ag   | $Ag^+$    | +1 e⁻ | +0.799 |
| Hg   | $Hg^{2+}$ | +2 e⁻ | +0.854 |
| Pt   | $Pt^{2+}$ | +2 e⁻ | +1.200 |
| Au   | $Au^{3+}$ | +3 e⁻ | +1.498 |

The standard potentials are determined under standard conditions at 25° C. and 1.013 bar in a 1-molar solution.

According to at least one embodiment, the first metal of the seed layer is selected from a group comprising gold (Au), silver (Ag), platinum (Pt) and copper (Cu). Preferably the first metal is gold.

According to at least one embodiment, the second metal is zinc (Zn), tin (Sn) or aluminum (Al). Preferably the second metal is zinc.

According to at least one embodiment, the first metal is gold and the second metal is zinc in the seed layer. By using gold and zinc instead of pure gold as the seed layer, no titanium adhesive layer is required as an adhesion agent.

According to at least one embodiment, the amount of the second metal is between 0.5 wt % and 10 wt % in the seed layer. In particular, the amount of the second metal in the seed layer is between 1 and 3 wt %, for example, 3 wt %.

According to at least one embodiment, the ratio first metal to second metal is between 95:5 and 99:1 in the seed layer. For example, the ratio first metal to second metal is 97:3.

According to at least one embodiment, the layer thickness of the seed layer is between 50 nm and 5000 nm, in particular between 150 nm and 220 nm, in particular between 180 nm and 210 nm, for example, 200 nm.

According to at least one embodiment, the seed layer is a monolayer layer.

According to at least one embodiment, the seed layer is shaped to reflect the radiation which can be emitted in the active region.

According to at least one embodiment, the first metal of the solder layer is galvanically deposited. The solder layer preferably comprises gold. The solder layer can comprise several sublayers. After deposition of the first partial layer with the first metal, a further partial layer can be deposited with another metal, for example, a third metal, which is also component of the solder layer. For example, tin can be the third metal. Alternatively, the first metal and the third metal can form a mixture and form the solder layer.

According to at least one embodiment, the component is configured to be installed in an adaptive headlamp. In particular, the adaptive headlamp is an adaptive front headlamp. Adaptive headlamps for vehicles, for example, are headlamps whose lighting intensity and direction can be adapted to the driving condition and the traffic situation so that the road can be optimally illuminated.

According to at least one embodiment, the component comprises a plurality of light generation regions, each having a p- and an n-contacting. In addition, the light generation regions can be arranged in a matrix shape. The light generation regions are preferably arranged on the side opposite the solder layer, so they form the main radiation emission surface of the semiconductor layer sequence.

The inventor has recognized that by using the seed layer described here, an adhesive layer, in particular made of titanium, can be omitted.

According to at least one embodiment, the optoelectronic component is free of an adhesive layer, especially free of titanium. This avoids the need for a plasma process for the selective removal of titanium after the application of a seed layer, for example, galvanically. This saves process steps, time and material. In addition, short circuits can be avoided by not completely removing the titanium, which is no longer required here.

This leads to a yield gain, process simplification and cost savings through process step reductions.

Further embodiments provide a method for producing an optoelectronic component. The optoelectronic component described here is preferably produced using the methods described here. All embodiments and definitions of the optoelectronic component also apply to the method and vice versa.

According to at least one embodiments, the method comprises the steps: A) providing a semiconductor layer sequence having an active region configured for radiation emission, B) applying a dielectric layer to the semiconductor layer sequence, C) applying a seed layer on the dielectric layer, wherein the seed layer comprises a first metal and a second metal, wherein the second metal is less noble than the first metal, D) applying a solder layer comprising the first metal to the seed layer, wherein the solder layer comprises the same first metal as the seed layer.

According to at least one embodiment, a second dielectric layer is applied to the seed layer in a structured manner before step D). All embodiments of the dielectric layer also apply to the second dielectric layer and vice versa. The second dielectric layer is then covered by a photoresist layer. The solder layer is then applied to the seed layer in step D) and the photoresist layer is then exposed. The photoresist layer is subsequently removed again so that depressions are created in the side cross-section at least up to the second dielectric layer and/or dielectric layer. This allows structured p- and n-contactings to be generated.

According to at least one embodiment the second dielectric layer and regions of the seed layer located below the second dielectric layer are removed again so that the depressions extend to the semiconductor layer sequence. Alternatively or additionally, the depressions extend to the n- and/or p-contacting.

BRIEF DESCRIPTION OF THE DRAWINGS

Further advantages, advantageous embodiments and developments result from the exemplary embodiments described in the following in connection with the figures Show it.

In the exemplary embodiments and figures, identical, similar or equivalent elements can each be provided with the same reference numbers. The represented elements and their proportions among each other are not to be regarded as true to scale. Rather, individual elements, such as layers, components, components and areas, can be displayed in an exaggeratedly large format for better representability and/or better understanding.

DETAILED DESCRIPTION OF ILLUSTRATIVE EMBODIMENTS

Figure 1:
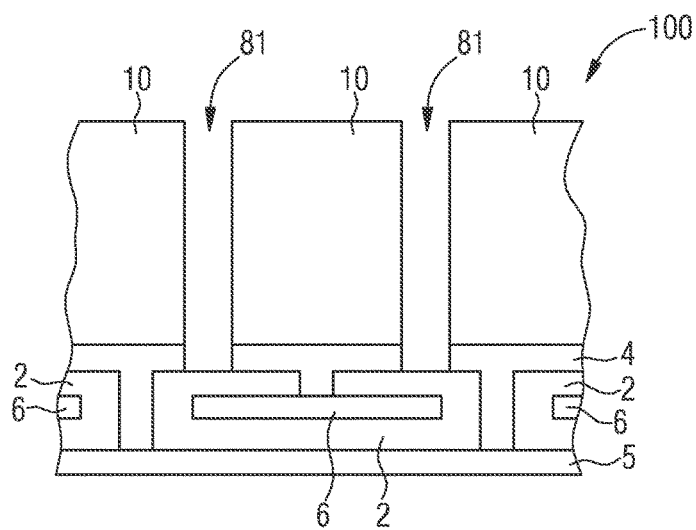
FIG. 1 shows a schematic side view of an optoelectronic component according to an embodiment.

FIG. 1 shows a schematic side view of an optoelectronic component 100 according to an embodiment. The optoelectronic component comprises a n-contacting 5. The component 100 comprises a p-contacting 6. The n- and p-contactings 5, 6 are isolated from each other by a dielectric layer 2 so that a short circuit is avoided. The component 100 comprises a seed layer 4. The dielectric layer 2 and the seed layer 4 are in direct contact with each other. In particular, the seed layer 4 is arranged at least partially on the dielectric layer 2 and on the side walls of the dielectric layer 2. The solder layer 10 is arranged on the seed layer 4, which is particularly composed of AuZn. The solder layer 10 here consists of several regions which are separated from each other by the depressions 81. The depressions 81 extend up to the dielectric layer 2. In addition to gold as the main component, the seed layer 4 also contains zinc, in particular with an amount of less than 10 wt %. The zinc can diffuse to the surface of the gold layer and forms an oxide layer. The solder layer 10, which is formed in particular from gold, can thus be easily galvanically deposited on the seed layer 4. An additional adhesive layer 31, for example, made of titanium, is no longer required in the component.

Alternatively, an adhesive layer 31 can be optionally available in the component (not shown here). The depressions 81 can be filled with a photoresist layer 9 and/or second dielectric layer 8 (not shown here). In plan view of the optoelectronic component 100 of FIG. 1, an optoelectronic component 100 of FIG. 2C would result.

Figure 2A:
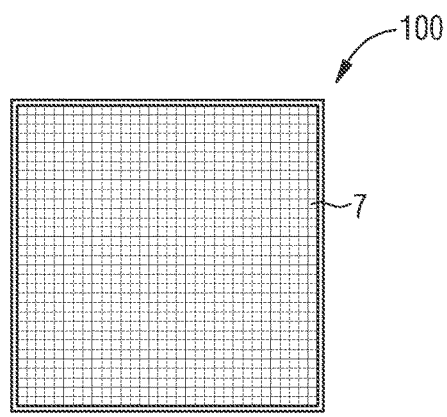
FIGS. 2A to 2C show schematic plan views of an optoelectronic component according to an embodiment.
Figure 2B:
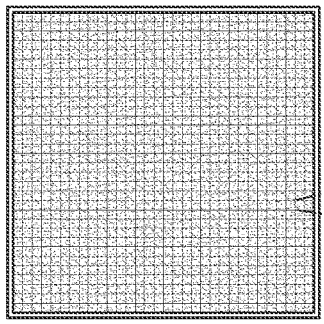
Figure 2C:
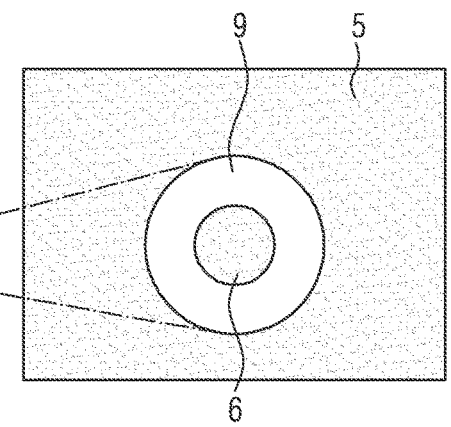
Figure 2D:
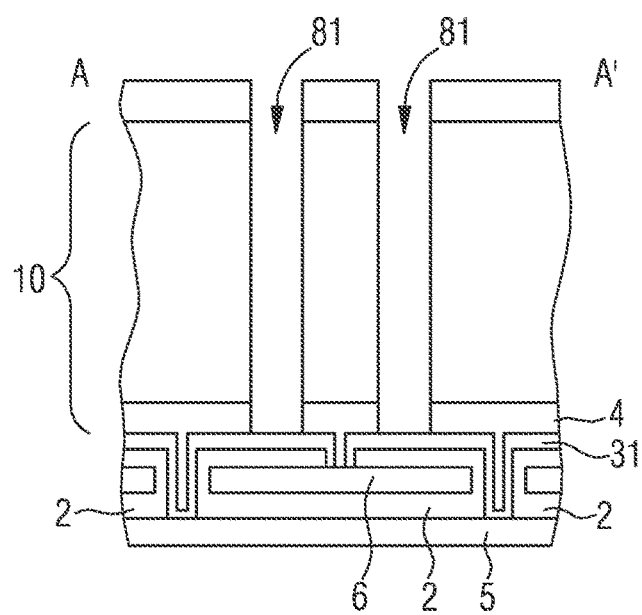
FIGS. 2D and 3B to 3C show schematic side views of an optoelectronic component according to an embodiment or comparison example.

FIGS. 2A to 2C show a schematic plan view of an optoelectronic component 100 according to an embodiment. FIG. 2D shows a schematic side view of an optoelectronic component.

FIG. 2A shows the component with a plurality of light generation regions 7. The light generation regions 7 are arranged in a matrix shape here. FIG. 2A shows the semiconductor layer sequence front side, so the side through which the radiation is emitted.

FIG. 2B shows the semiconductor layer sequence reverse side. The solder layer 10 can be galvanically grown on or attached to this semiconductor layer sequence reverse side.

FIG. 2C shows an excerpt of the reverse side of the semiconductor layer sequence 1. The n-contacting 5 and the p-contacting 6 are shown which are spatially separated from each other. In particular, a photoresist layer 9 is arranged between the n-contacting and the p-contacting 5, 6 at least during production. This photoresist layer 9 can be removed again in a subsequent method step so that the n- and p-contacting 5, 6 are electrically separated from each other.

FIG. 2D shows the corresponding schematic side view of the optoelectronic component, which essentially corresponds to the embodiment of FIG. 1, with the exception that an adhesive layer 31 is still present in the component. The adhesive layer 31 can also be omitted here as an alternate.

Figure 3A:
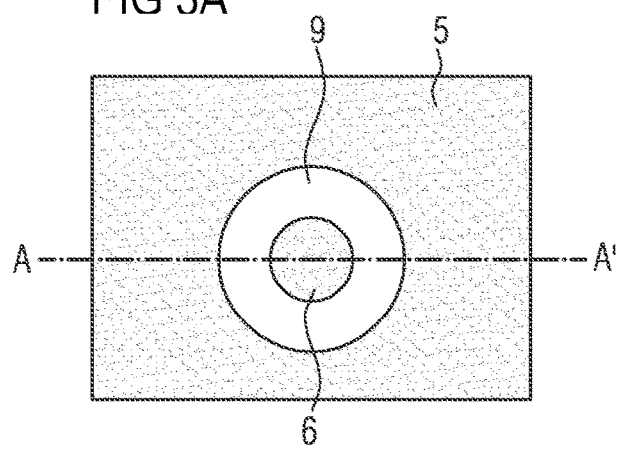
FIG. 3A shows a schematic plan view of an optoelectronic component according to an embodiment.

FIG. 3A essentially corresponds to FIG. 2C and shows a cross-section A-A' through the semiconductor layer sequence reverse side.

Figure 3B:
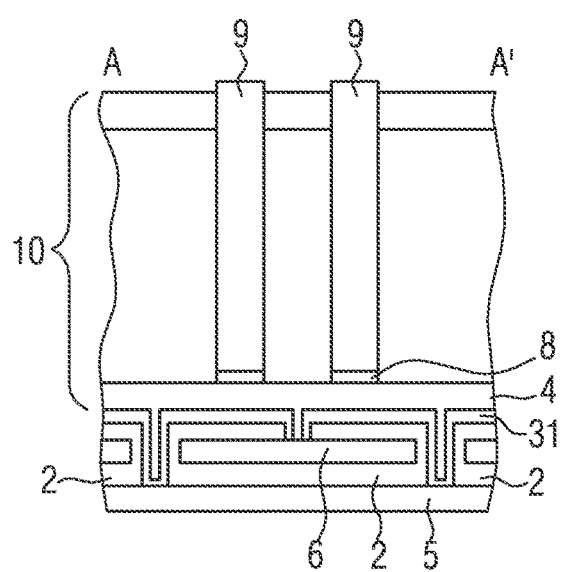
Figure 3C:
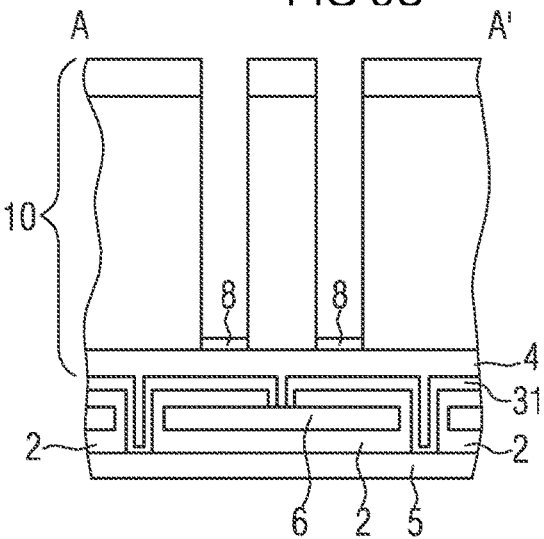

The sectional views are shown in FIGS. 3B and 3C respectively. The component of FIG. 3B has essentially the same structure as the component of FIG. 1, except that a photoresist layer 9 and a second dielectric layer 8 are arranged in the depressions 81. In addition, the component 100 of FIG. 3B comprises an adhesive layer 31, which can be formed from titanium, for example. This adhesive layer 31 is preferably missing in the optoelectronic component 100 described here.

Compared to FIG. 3B, FIG. 3C does not have a photoresist layer 9, but the second dielectric layer 8, which is arranged in the depression 81. The second dielectric layer 8 can be removed by a process such as SF6 or SF6-Ar plasma, so that the depression 81 extend to the dielectric layer 8 or to the adhesive layer 31.

The adhesive layer 31 of the FIGS. 3B and 3C is optional here and can preferably miss. The solder layer 10 is preferably made of gold and can be galvanically deposited on it. For this purpose the seed layer 4 is necessary so that the solder layer 10 can grow. So far gold seed layers were used; thereby additional adhesive layers 31 of titanium were necessary.

The inventor has now recognized that the adhesive layer 31 can be omitted due to the material composition of the seed layer 4, so by addition of a second less noble metal to the seed layer 4. The adhesive layer 31, which is composed in particular of titanium, shows the disadvantages that, for example, when producing the contacting layers 5, 6, in addition to the removal of the solder layer 10 by means of wet chemistry, plasma processes are also necessary for the selective removal of the adhesive layer 31. However, these plasma processes are not reproducible and cannot sufficiently remove the material of the adhesive layer. Therefore short circuits are generated or can be generated.

In the component as described here, an adhesive layer 31 can preferably be omitted by selecting the materials of seed layer 4.

Figure 4A:
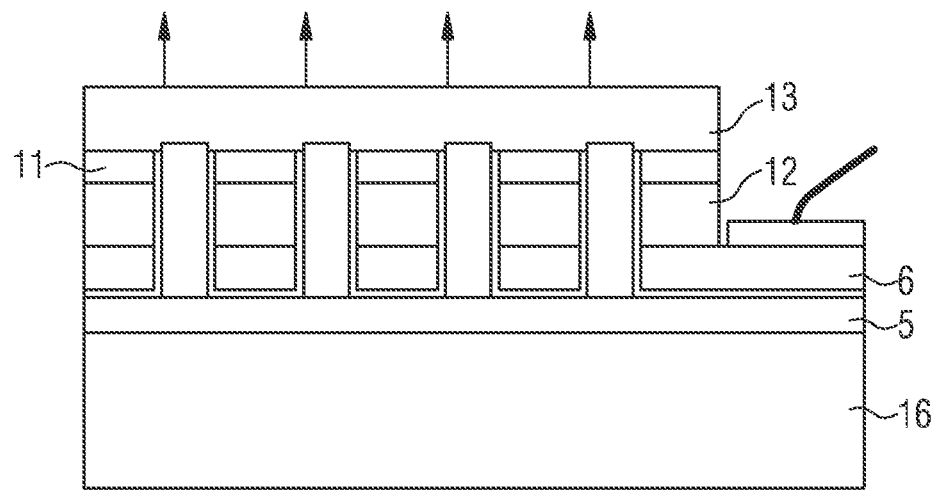
FIGS. 4A and 4B show semiconductor layer sequences according to an embodiment.
Figure 4B:
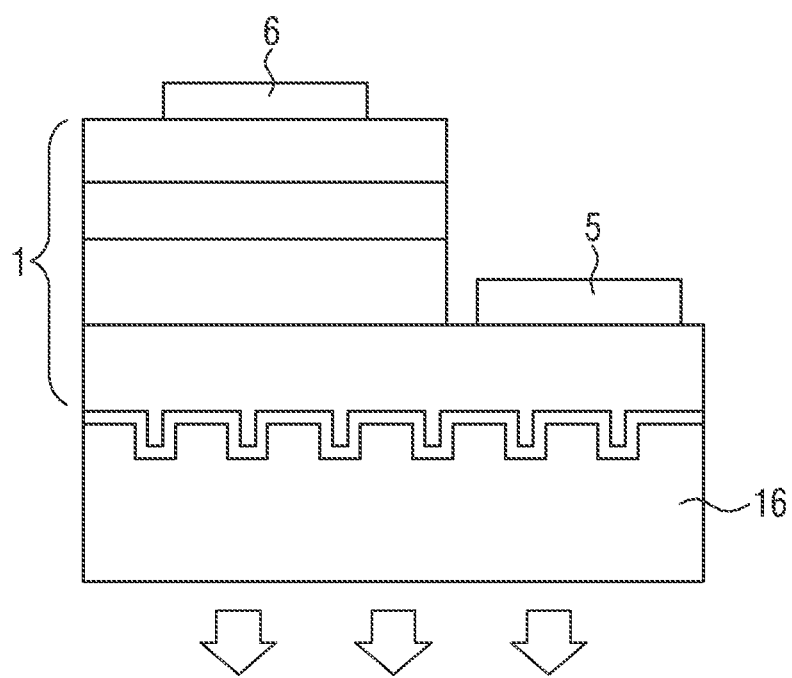

FIGS. 4A and 4B each show an optoelectronic component 100 according to one embodiment. The component of FIG. 4A comprises a carrier 16 on which an n-contacting is arranged. A p-contacting is arranged above the n-contacting. The component 100 also comprises a semiconductor layer sequence 1 comprising a p-doped semiconductor layer 12, an n-doped semiconductor layer 13 and an active region 11. The n-contacting 5 extends to the n-doped semiconductor layer and contacts it electrically. The p-contacting electrically contacts the p-doped semiconductor layer 12. The component in FIG. 4A can also comprises the here described dielectric layer 2, solder layer 10 and seed layer 4 according to the above described embodiments (not shown here).

FIG. 4B shows a so-called flip chip. This means that the contactings 5, 6 are arranged on the same side of the semiconductor layer sequence 1. The semiconductor layer sequence 1 can be arranged on a carrier 16. The arrangement described in FIG. 4B can comprise the solder layer 10, dielectric layer 2 and the seed layer 4 (not shown here) according to the above described embodiments is applicable accordingly.

The execution examples described in connection with the figures and their features can also be combined with each other according to further execution examples, even if such combinations are not explicitly shown in the figures. Moreover, the execution examples described in connection with the figures may have additional or alternative features as described in the general part.

The exemplary embodiments described in connection with the figures and their features can also be combined with each other according to further exemplary embodiments, even if such combinations are not explicitly disclosed in connection with the figures. Furthermore, the exemplary embodiments described in connection with the figures can have additional or alternative features according to the description in the general part.

The invention is not limited by the description based on the exemplary embodiments of these. Rather, the invention includes any new feature as well as any combination of features, which in particular includes any combination of features in the patent claims, even if this feature or this combination itself is not explicitly specified in the patent claims or exemplary embodiments.

The invention claimed is:

1. A method for producing an optoelectronic component, the method comprising:
   providing a semiconductor layer sequence having an active region for emitting radiation;
   applying a dielectric layer to the semiconductor layer sequence;
   applying a seed layer to the dielectric layer, wherein the seed layer comprises a first metal and a second metal, wherein the second metal is less noble than the first metal, wherein an amount of the second metal in the seed layer is between 0.5 wt % and 10 wt %, or a ratio of the first metal to the second metal in the seed layer is between 95:5 and 99:1; and
   applying a solder layer comprising the first metal to the seed layer.

2. The method according to claim 1, wherein the seed layer is reflective for the radiation generated in the active region.

3. The method according to claim 1, wherein the first metal is Au and the second metal is Zn.

4. The method according to claim 1, wherein the second metal is zinc, tin or aluminum.

5. The method according to claim 1, wherein the seed layer is a monolayer layer.

6. The method according to claim 1, wherein the seed layer is free of titanium.

7. The method according to claim 1, wherein the first metal is Au, Ag, Pt or Cu.

8. The method according to claim 1, further comprising:
   applying a second dielectric layer to the seed layer in a structured manner before applying the solder layer;
   covering the second dielectric layer with a photoresist layer, wherein the solder layer is applied to the seed layer;
   exposing the photoresist layer; and
   removing the photoresist layer so that depressions are formed up to the second dielectric layer or the dielectric layer.

9. The method according to claim 8, wherein the second dielectric layer and regions of the seed layer, which are located below the second dielectric layer, are removed so that the depressions extend to the semiconductor layer sequence and/or an n-contacting and/or a p-contacting.

10. An optoelectronic component comprising:
    a semiconductor layer sequence having an active region configured to emit radiation;
    a dielectric layer;
    a solder layer comprising a first metal arranged on the dielectric layer; and
    a seed layer arranged between the solder layer and the dielectric layer,
    wherein the seed layer comprises the first metal and a second metal, wherein the second metal is less noble than the first metal,
    wherein an amount of the second metal in the seed layer is between 0.5 wt % and 10 wt %, and
    wherein the first metal is Au and the second metal is Zn.

11. The optoelectronic component according to claim 10, wherein the optoelectronic component comprises a plurality of light generation regions, each light generation region having a p-contacting and an n-contacting, and wherein the light generation regions are arranged in a matrix shape.

12. The optoelectronic component according to claim 10, wherein the dielectric layer comprises a material which is selected from the group consisting of silicon oxide, silicon nitride, aluminum oxide, zirconium oxide, titanium oxide, yttrium oxide, and silicon.

13. The optoelectronic component according to claim 10, further comprising an n-contacting and a p-contacting, wherein the dielectric layer provides isolation for the two contactings.

14. The optoelectronic component according to claim 10, wherein the seed layer has a layer thickness of between 50 nm and 5000 nm inclusive.

15. The optoelectronic component according to claim 10, wherein the seed layer is reflective for the radiation generated in the active region.

16. The optoelectronic component according to claim 10, wherein the first metal of the solder layer is galvanically deposited.

17. The optoelectronic component according to claim 10, wherein the seed layer is a monolayer layer.

18. The optoelectronic component according to claim 10, wherein the seed layer is free of titanium.

19. An adaptive headlamp comprising:
    the optoelectronic component according to claim 10.

20. An optoelectronic component comprising:
    a semiconductor layer sequence having an active region configured to emit radiation;
    a dielectric layer;
    a solder layer comprising a first metal arranged on the dielectric layer, the solder layer configured to create a bond between the semiconductor layer sequence and an external substrate; and
    a seed layer arranged between the solder layer and the dielectric layer, the seed layer being directly adjacent to both the solder layer and the dielectric layer so that no further layers are arranged between the solder layer and the seed layer,
    wherein the seed layer comprises the first metal and a second metal, wherein the second metal is less noble than the first metal,
    wherein an amount of the second metal in the seed layer is between 0.5 wt % and 10 wt %, and
    wherein the first metal is Au and the second metal is Zn.

* * * * *